US012603115B2

(12) United States Patent
Sethuraman et al.

(10) Patent No.: US 12,603,115 B2
(45) Date of Patent: Apr. 14, 2026

(54) METHOD AND APPARATUS TO PERFORM TRAINING ON A DATA BUS BETWEEN A DYNAMIC RANDOM ACCESS MEMORY (DRAM) AND A DATA BUFFER ON A BUFFERED DUAL IN-LINE MEMORY MODULE

(71) Applicant: Intel Corporation, Santa Clara, CA (US)

(72) Inventors: Saravanan Sethuraman, Portland, OR (US); Tonia M. Rose, Wendell, NC (US); George Vergis, Portland, OR (US); John V. Lovelace, Driftwood, TX (US)

(73) Assignee: Intel Corporation, Santa Clara, CA (US)

( * ) Notice: Subject to any disclaimer, the term of this patent is extended or adjusted under 35 U.S.C. 154(b) by 691 days.

(21) Appl. No.: 17/950,663

(22) Filed: Sep. 22, 2022

(65) Prior Publication Data
US 2023/0017161 A1    Jan. 19, 2023

(51) Int. Cl.
*G11C 7/10* (2006.01)
*G11C 7/22* (2006.01)
*G11C 11/4063* (2006.01)

(52) U.S. Cl.
CPC ............ *G11C 7/1084* (2013.01); *G11C 7/222* (2013.01); *G11C 11/4063* (2013.01)

(58) Field of Classification Search
CPC ... G11C 7/1084; G11C 7/222; G11C 11/4063; G11C 29/023; G11C 29/50012; G11C 7/225; G11C 2207/2254; G11C 29/022; G11C 5/04
See application file for complete search history.

(56) References Cited

U.S. PATENT DOCUMENTS

| | | | | |
|---|---|---|---|---|
| 6,691,214 B1 * | 2/2004 | Li | .......................... | G11C 7/1078 |
| | | | | 713/400 |
| 2017/0323222 A1 * | 11/2017 | Rao | ......................... | G11C 29/36 |
| 2023/0298642 A1 * | 9/2023 | Partsch | ................ | G11C 7/1084 |
| | | | | 365/189.05 |

OTHER PUBLICATIONS

Jedec Solid State Technology Association, "DDR5 Data Buffer Definition (DDR5DB01)—Rev 1.1" JESD82-521, Published Dec. 2021, 256 pages.

(Continued)

*Primary Examiner* — Jay W. Radke
(74) *Attorney, Agent, or Firm* — Compass IP Law PC

(57) ABSTRACT

System boot time is decreased by performing Memory Receive enable (MRE) training and MDQ-MDQS Read Delay (MRD) training on a buffered Dual In-Line Memory Module (DIMM). MRE training configures the time at which a data buffer on the buffered DIMM enables its receivers to capture data read from DRAM integrated circuits on a MDQ/MDQS bus between the DRAM and the data buffer on the DIMM. After the MRE training has completed, the data buffer is configured to enable the data buffer receivers to receive data on the MDQ bus on the buffered DIMM during the preamble of the incoming MDQS burst from a read transaction in the DRAM. MRD training tunes the relationship between the MDQ/MDQS bus to ensure sufficient setup and hold eye margins for MDQ so that the data buffer optimally samples the data driven by the DRAM during reads of the DRAM.

19 Claims, 9 Drawing Sheets

(56) References Cited

OTHER PUBLICATIONS

Jedec Solid State Technology Association, "DDR5 Load Reduced (LRDIMM) and Registered Dual Inline Memory Module (RDIMM) Common Specification", JESD305, Published Jan. 2022, 46 pages.
Jedec Solid State Technology Association, "DDR5 Registering Clock Driver Definition (DDR5RCD01)", JESD82-511, Published Aug. 2021, 270 pages.

* cited by examiner

400

RCD to send commands for MRE training to DRAM

402

RCD to send commands for MRE training to Data Buffer

404

Data Buffer to perform MRE training

406

Data Buffer to send results of MRE Training to RCD

600

RCD to send commands for MRD training to DRAM

602

RCD to send commands for MRD training to Data Buffer

604

Perform MRD training

606

Data Buffer to send results of MRD Training to RCD

METHOD AND APPARATUS TO PERFORM TRAINING ON A DATA BUS BETWEEN A DYNAMIC RANDOM ACCESS MEMORY (DRAM) AND A DATA BUFFER ON A BUFFERED DUAL IN-LINE MEMORY MODULE

FIELD

This disclosure relates to a memory module with a data buffer and in particular to DRAM bus training on the interface between the DRAM and data buffer on the memory module.

BACKGROUND

A memory module is a printed circuit board on which memory integrated circuits ("chips") are mounted to another printed circuit board, such as a motherboard, via a connector (also referred to as a "socket"). The connector is installed on the motherboard and a memory module is inserted into the connector. The connector enables interconnection between a memory module and a circuit on the motherboard.

A dual in-line memory module (DIMM) has separate electrical contacts on each side of the memory module. A memory rank is a set of memory chips connected to the same chip select. A single-rank DIMM has one set of memory integrated circuits that is accessed while writing to or reading from the memory. A dual-rank DIMM is equivalent to two single-rank DIMMs on the same module, with only one rank accessible at a time. A quad-rank MINIM is equivalent to two dual-rank DIMMs on the same module.

Load Reduced Double Data Rate Dual In-Line Memory Module (LR-DIMM) modules reduce the electrical loading on the memory bus by including a data buffer. The data buffer increases the memory bus speed by reducing the load for data input.

BRIEF DESCRIPTION OF THE DRAWINGS

Features of embodiments of the claimed subject matter will become apparent as the following detailed description proceeds, and upon reference to the drawings, in which like numerals depict like parts, and in which:

Figure 1:
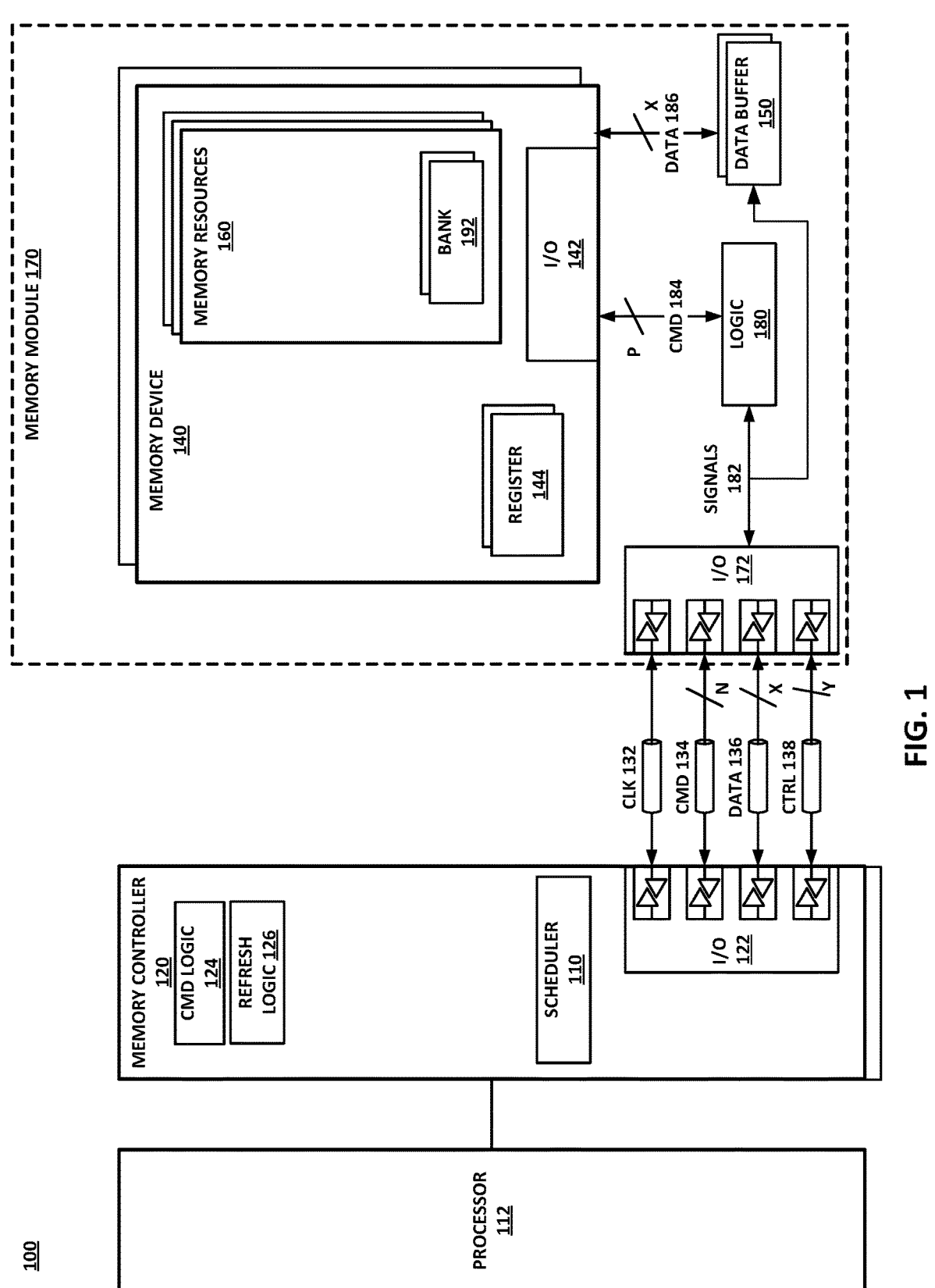
FIG. 1 is a block diagram of an embodiment of a system with a memory subsystem in which MDQS receive enable training and MDQDS read delay training can be performed from the DRAM to the data buffer.

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DESCRIPTION OF EMBODIMENTS

A Load Reduced Double Data Rate Dual In-Line Memory Module (LR-DIMM) and a Multiplexed Rank MINIM (MR-DIMM) include DRAM integrated circuits that can have 4 DQ (data) signals (×4) or 8 DQ (data) signals (×8). Two differential DQS strobe signals can be used to sample the 8 DQ signals with one differential DQS Strobe signal used to sample each group of 4 DQ signals.

A differential DQS strobe signal is trained before it is used for read and write of the DRAM integrated circuits. The training is controlled by a host communicatively coupled to a buffer in the LR-DIMM/MR-DIMM.

Host controlled Memory Receive enable (MRE) training configures the time at which a data buffer on the LR-DIMM/MR-DIMM enables its receivers to capture data read from DRAM integrated circuits on a memory module data (MDQ)/memory module data signal (MDQS) bus between the DRAM integrated circuits and the data buffer on the LR-DIMM/MR-DIMM. Data read from the DRAM integrated circuits is sent to the data buffer on the MDQ/MDQS bus. The data buffer retransmits the data received from the DRAM integrated circuits to the host on the DQ/DQS bus. The time at which the data buffer enables its receivers using an internal receive-enable signal to capture the data, is configured by the host controlled MRE training. After the host controlled MRE training has completed, the data buffer is configured to enable the data buffer receivers to receive data on the MDQ bus on the LR-DIMM/MR-DIMM during the preamble of the incoming MDQS burst from a read transaction in the DRAM integrated circuits.

Host controlled receive enable training mode requires host writes and host reads and multiple commands for example, MPC commands to enter and exit training mode are dispatched from the host to perform the training. This results in an increase in system boot time.

System boot time is decreased by performing MRE training on a buffered MINIM using a receive enable (RCVEN) signal generated by the data buffer on the buffered DIMM.

Host controlled Memory MDQ-MDQS Read Delay (MRD) training tunes the relationship between memory module data (MDQ) signal lines and memory module data strobe (MDQS) signal lines to ensure sufficient setup and hold eye margins for MDQ so that the data buffer optimally samples the data driven by the DRAM during reads of the DRAM.

Host controlled MRD training requires host writes and host reads and multiple commands for example, MPC commands to enter and exit training mode are dispatched from the host to perform the training. This results in an increase in system boot time.

System boot time is decreased by performing MRD training on a buffered DIMM.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

FIG. 1 is a block diagram of an embodiment of a system 100 with a memory subsystem in which MDQS receive enable (MRE) training and MDQDS read delay (MRD) training can be performed. The system 100 includes at least one memory module 170 coupled to a memory controller 120. The memory controller 120 includes command logic 124, refresh logic 126, and a scheduler 110.

System 100 includes a processor 112 and elements of a memory subsystem in a computing device. Processor 112 represents a processing unit of a computing platform that can execute an operating system (OS) and applications, which can collectively be referred to as the host or user of the memory. The OS and applications execute operations that result in memory accesses. Processor 112 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or storage controller. Such devices can be integrated with the processor in some systems (for example, in a System-on-Chip (SoC)) or attached to the processer via a bus (e.g., Peripheral Component Interconnect express (PCIe)), or a combination.

Reference to memory devices can apply to volatile memory technologies or non-volatile memory technologies. Descriptions herein referring to a "RAM" (random access memory) or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one embodiment, a system with volatile memory that needs to be refreshed can also include nonvolatile memory.

Volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, originally published in September 2012 by JEDEC), DDR5 (DDR version 5, originally published in July 2020), LPDDR3 (Low Power DDR version 3, JESD209-3B, August 2013 by JEDEC), LPDDR4 (LPDDR version 4, JESD209-4, originally published by JEDEC in August 2014), LPDDR5 (LPDDR version 5, JESD209-5A, originally published by JEDEC in January 2020), WIO2 (Wide Input/Output version 2, JESD229-2 originally published by JEDEC in August 2014), HBM (High Bandwidth Memory, JESD235, originally published by JEDEC in October 2013), HBM2 (HBM version 2, JESD235C, originally published by JEDEC in January 2020), or HBM3 (HBM version 3 currently in discussion by JEDEC), or others or combinations of memory technologies, and technologies based on derivatives or extensions of such specifications. The JEDEC standards are available at www.jedec.org.

Memory controller 120 represents one or more memory controller circuits or devices for system 100. Memory controller 120 represents control logic that generates memory access commands in response to the execution of operations by processor 112. Memory controller 120 accesses one or more memory devices 140. Memory devices 140 can be DRAM devices in accordance with any referred to above. Memory controller 120 includes I/O interface logic 122 to couple to a memory bus. I/O interface logic 122 (as well as I/O interface logic 142 of memory device 140) can include pins, pads, connectors, signal lines, traces, or wires, or other hardware to connect the devices, or a combination of these. I/O interface logic 122 can include a hardware interface. As illustrated, I/O interface logic 122 includes at least drivers/transceivers for signal lines. Commonly, wires within an integrated circuit interface couple with a pad, pin, or connector to interface signal lines or traces or other wires between devices. I/O interface logic 122 can include drivers, receivers, transceivers, or termination, or other circuitry or combinations of circuitry to exchange signals on the signal lines between the devices.

The exchange of signals includes at least one of transmit or receive. While shown as coupling I/O interface logic 122 from memory controller 120 to I/O interface logic 142 of memory device 140, it will be understood that in an implementation of system 100 where groups of memory devices 140 are accessed in parallel, multiple memory devices can include I/O interfaces to the same interface of memory controller 120. In an implementation of system 100 including one or more memory modules 170, I/O interface logic 142 can include interface hardware of the memory module in addition to interface hardware on the memory device itself. Other memory controllers 120 can include separate interfaces to other memory devices 140.

The bus between memory controller 120 and memory devices 140 can be a double data rate (DDR) high-speed DRAM interface to transfer data that is implemented as multiple signal lines coupling the memory controller 120 to memory devices 140. The bus may typically include at least clock (CLK) 132, command/address (CMD) 134, and data (write data (DQ) and read data (DQ) 136, and zero or more control signal lines 138. In one embodiment, a bus or connection between memory controller 120 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for data (write DQ and read DQ) can be referred to as a "data bus." It will be understood that in addition to the lines explicitly shown, a bus can include at least one of strobe signaling lines (for example, data strobe (DQS)), alert lines, auxiliary lines, or other signal lines, or a combination. It will also be understood that serial bus technologies can be used for the connection between memory controller 120 and memory devices 140. An example of a serial bus technology is 8B10B encoding and transmission of high-speed data with embedded clock over a single differential pair of signals in each direction.

In one embodiment, one or more of CLK 132, CMD 134, or control signal lines 138 can be routed to memory devices 140 through logic 180. Each memory device 140 has a data buffer 150. Data 136 ((write data (DQ) and read data (DQ)) and strobe signaling lines (for example, data strobe (DQS)) are routed through the data buffer 150 to/from the memory device 140. The data buffer 150 reduces the loading on the data signals to I/O interface 122, which allows faster signaling or reduced errors or both. The reduced loading can be because I/O interface 122 sees only the termination of one or more data signals at data buffer 150, instead of termination of the data signal lines at every one of memory devices 140 in parallel. While I/O interface logic 142 is not specifically illustrated to include drivers or transceivers, it will be understood that I/O interface logic 142 includes hardware necessary to couple to the signal lines.

Additionally, for purposes of simplicity in illustrations, I/O interface logic 142 does not illustrate all signals corresponding to what is shown with respect to I/O interface 122. In one embodiment, all signals of I/O interface 122 have counterparts at I/O interface logic 142. Some or all of the signal lines interfacing I/O interface logic 142 can be provided from logic 180 or data buffer 150. In one embodiment, certain signals from I/O interface 122 do not directly couple to I/O interface logic 142, but couple through logic 180 or data buffer 150, while one or more other signals may directly couple to I/O interface logic 142 from I/O interface 122 via I/O interface 172, but without being buffered through logic 180 or data buffer 150. Signals 182 represent the signals that interface with memory devices 140 through logic 180 or data buffer 150.

It will be understood that in the example of system 100, the bus between memory controller 120 and memory devices 140 includes a subsidiary command bus CMD 134 and a subsidiary data bus 136. In one embodiment, the subsidiary data bus 136 can include bidirectional lines for read data and for write/command data. In another embodiment, the subsidiary data bus 136 can include unidirectional write signal lines for write and data from the host to memory, and can include unidirectional lines for read data from the memory device 140 to the host. In accordance with the chosen memory technology and system design, control signal lines 138 may accompany a bus or sub-bus, such as strobe lines DQS. Based on design of system 100, or implementation if a design supports multiple implementations, the data bus can have more or less bandwidth per memory device 140. For example, the data bus can support memory devices 140 that have either a ×32 interface, a ×16 interface, a ×8 interface, a ×4 interface or another interface. The convention "×W," where W is an integer that refers to an interface size or width of the interface of memory device 140, which represents a number of signal lines to exchange data with memory controller 120. The number is often binary, but is not so limited. The interface size of the memory devices is a controlling factor on how many memory devices can be used concurrently in system 100 or coupled in parallel to the same signal lines. In one embodiment, high bandwidth memory devices, wide interface devices, or stacked memory configurations, or combinations, can enable wider interfaces, such as a ×128 interface, a ×256 interface, a ×512 interface, a ×1024 interface, or other data bus interface width.

Memory devices 140 represent memory resources for system 100. In one embodiment, each memory device 140 is a separate memory die. Each memory device 140 includes I/O interface logic 142, which has a bandwidth determined by the implementation of the device (e.g., ×16, ×8, ×4 or some other interface bandwidth). I/O interface logic 142 enables each memory device 140 to interface with memory controller 120. I/O interface logic 142 can include a hardware interface, and can be in accordance with I/O interface logic 122 of memory controller 120, but at the memory device end. In one embodiment, multiple memory devices 140 are connected in parallel to the same command and data buses. In another embodiment, multiple memory devices 140 are connected in parallel to the same command bus, and are connected to different data buses. For example, system 100 can be configured with multiple memory devices 140 coupled in parallel, with each memory device responding to a command, and accessing memory resources 160 internal to each. For a write operation, an individual memory device 140 can write a portion of the overall data word, and for a read operation, an individual memory device 140 can fetch a portion of the overall data word. As non-limiting examples, a specific memory device can provide or receive, respectively, 8 bits of a 128-bit data word for a Read or Write transaction, or 8 bits or 16 bits (depending for a ×8 or a ×16 device) of a 256-bit data word. The remaining bits of the word are provided or received by other memory devices in parallel.

In one embodiment, memory devices 140 can be organized into memory modules 170. In one embodiment, memory modules 170 represent dual inline memory modules (DIMMs). Memory modules 170 can include multiple memory devices 140, and the memory modules 170 can include support for multiple separate channels to the included memory devices 140 disposed on them.

Memory devices 140 each include memory resources 160. Memory resources 160 represent individual arrays of memory locations or storage locations for data. Typically, memory resources 160 are managed as rows of data, accessed via word line (rows) and bit line (individual bits within a row) control. Memory resources 160 can be organized as separate banks of memory. Banks 192 may refer to arrays of memory locations within a memory device 140. In one embodiment, banks of memory are divided into sub-banks with at least a portion of shared circuitry (e.g., drivers, signal lines, control logic) for the sub-banks.

In one embodiment, memory devices 140 include one or more registers 144. Register 144 represents one or more storage devices or storage locations that provide configuration or settings for the operation of the memory device. In one embodiment, register 144 can provide a storage location for memory device 140 to store data for access by memory controller 120 as part of a control or management operation. In one embodiment, register 144 includes one or more mode registers. In one embodiment, register 144 includes one or more multipurpose registers. The configuration of locations within register 144 can configure memory device 140 to operate in different "mode," where command information can trigger different operations within memory device 140 based on the mode. Additionally, or in the alternative, different modes can also trigger different operation from address information or other signal lines depending on the mode. Settings of register 144 can indicate configuration for I/O settings (e.g., timing, termination, driver configuration, or other I/O settings).

Memory controller 120 includes scheduler 110, which represents logic or circuitry to generate and order transactions to send to memory device 140. From one perspective, the primary function of memory controller 120 is to schedule memory access and other transactions to memory device 140. Such scheduling can include generating the transactions themselves to implement the requests for data by processor 112 and to maintain integrity of the data (e.g., such as with commands related to refresh).

Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 120 typically includes logic to allow selection and ordering of transactions to improve performance of system 100. Thus, memory controller 120 can select which of the outstanding transactions should be sent to memory device 140 in which order, which is typically achieved with logic much more complex than a simple first-in first-out algorithm. Memory controller 120 manages the transmission of the transactions to memory device 140, and manages the timing associated with the transaction. In one embodiment, transactions have deterministic timing, which can be managed by memory controller 120 and used in determining how to schedule the transactions.

Referring again to memory controller 120, memory controller 120 includes command (CMD) logic 124, which represents logic or circuitry to generate commands to send to memory devices 140. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 140, memory controller 120 can issue commands via I/O 122 to cause memory device 140 to execute the commands. Memory controller 120 can implement compliance with standards or specifications by access scheduling and control.

Referring again to logic 180 and data buffer 150, in one embodiment, logic 180 buffers certain signals 182 from the host to memory devices 140. In one embodiment, data buffer 150 buffers data (DQ) signal lines 136 as data 186, and buffers command (or command and address) lines of CMD 134 as CMD 184. In one embodiment, data 186 is buffered, but includes the same number of signal lines as data 136. Thus, both are illustrated as having X signal lines. In contrast, CMD 134 has fewer signal lines than CMD 184. Thus, P>N. The N signal lines of CMD 134 are operated at a data rate that is higher than the P signal lines of CMD 184. For example, P can equal 2N, and CMD 184 can be operated at a data rate of half the data rate of CMD 134.

In one embodiment, memory controller 120 includes refresh logic 126. Refresh logic 126 can be used for memory resources 160 that are volatile and need to be refreshed to retain a deterministic state. In one embodiment, refresh logic 126 indicates a location for refresh, and a type of refresh to perform. Refresh logic 126 can execute external refreshes by sending refresh commands. For example, in one embodiment, system 100 supports all bank refreshes as well as per bank refreshes. All bank refreshes cause the refreshing of a selected bank 192 within all memory devices 140 coupled in parallel. Per bank refreshes cause the refreshing of a specified bank 192 within a specified memory device 140.

System 100 can include a memory circuit, which can be or include logic 180. To the extent that the circuit is considered to be logic 180, it can refer to a circuit or component (such as one or more discrete elements, or one or more elements of a logic chip package) that buffers the command bus. To the extent the circuit is considered to include logic 180, the circuit can include the pins of packaging of the one or more components, and may include the signal lines. The memory circuit includes an interface to the N signal lines of CMD 134, which are to be operated at a first data rate. The N signal lines of CMD 134 are host-facing with respect to logic 180. The memory circuit can also include an interface to the P signal lines of CMD 184, which are to be operated at a second data rate lower than the first data rate. The P signal lines of CMD 184 are memory-facing with respect to logic 180. Logic 180 can either be considered to be the control logic that receives the command signals and provides them to the memory devices, or can include control logic within it (e.g., its processing elements or logic core) that receive the command signals and provide them to the memory devices.

Figure 2:
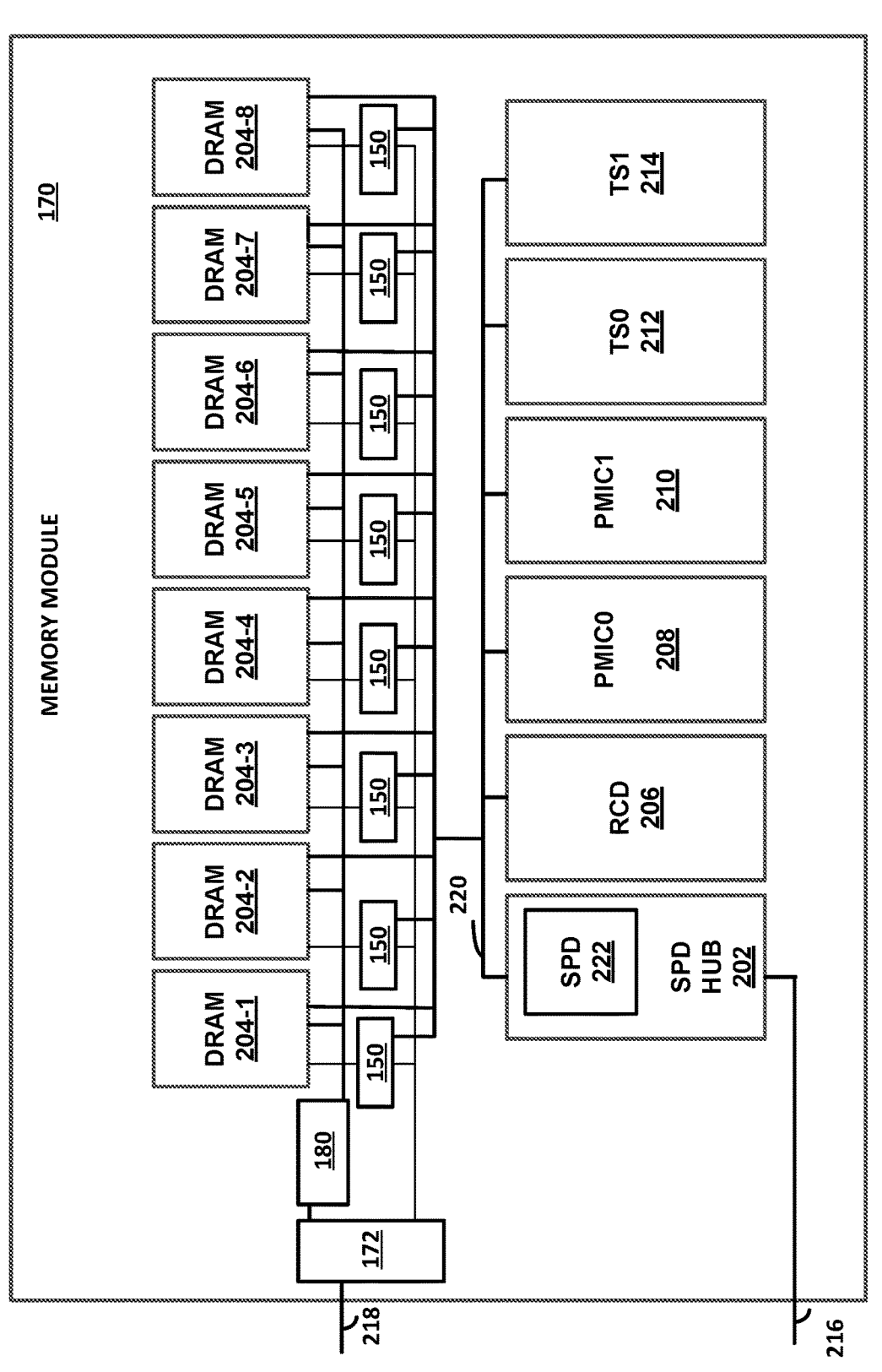
FIG. 2 is a block diagram of the memory module in FIG. 1 that includes a plurality of Dynamic Random Access Memory (DRAM) chips and a plurality of data buffers.

FIG. 2 is a block diagram of the memory module 170 in FIG. 1 that includes a plurality of Dynamic Random Access Memory (DRAM) chips 204-1, . . . , 204-8 and a plurality of data buffers 150. A host system communicates with the DRAM chips 204-1, . . . , 204-8 via a memory bus 218. Memory bus 218 includes CLK 132, CMD 134, DATA 136 and CTRL 138 signals discussed in conjunction with FIG. 1. Each of the Dynamic Random Access Memory (DRAM) chips 204-1, . . . , 24-8 is communicatively coupled to one of the plurality of data buffers 150.

The memory module 170 communicates with a host system via a sideband bus 216. The sideband bus 216 may be compatible with the JESD403-1 JEDEC (Joint Electronic Device Engineering Council) Module Sideband Bus standard that is a subset and superset of the MIPI Alliance™ I3C Basic^SM serial bus standard, MIPI Alliance™ I3C bus.

The memory module 170 has two temperature sensors (TS), a first temperature sensor TS0 212 and a second temperature sensor TS1 214, to measure the temperature of the DRAM chips 204-1, . . . , 204-8 on the memory module 170. The memory module 170 includes two Power Management ICs (PMICs) PMIC0 208, PMIC1 210, a Registering Clock Driver (RCD) 206, and a Sideband Bus Device Hub (SPD Hub) 202 that includes a Serial Presence Detect (SPD) device 222 which acts as the SPD to redrive the sideband bus 216 to a local bus 220 for the Power Management ICs (PMICs) PMIC0 208, PMIC1 210, a Registering Clock Driver (RCD) 206 and the first temperature sensor TS0 212 and the second temperature sensor TS8 214.

The local bus 220 is also coupled to each data buffer 150 and to each of the Dynamic Random Access Memory (DRAM) chips 204-1, . . . , 204-8 on the memory module 170. The memory module 170 can be a Load Reduced Double Data Rate Dual In-Line Memory Module (LR-DIMM) or a Multiplexed Rank DIMM (MR-DIMM).

Figure 3:
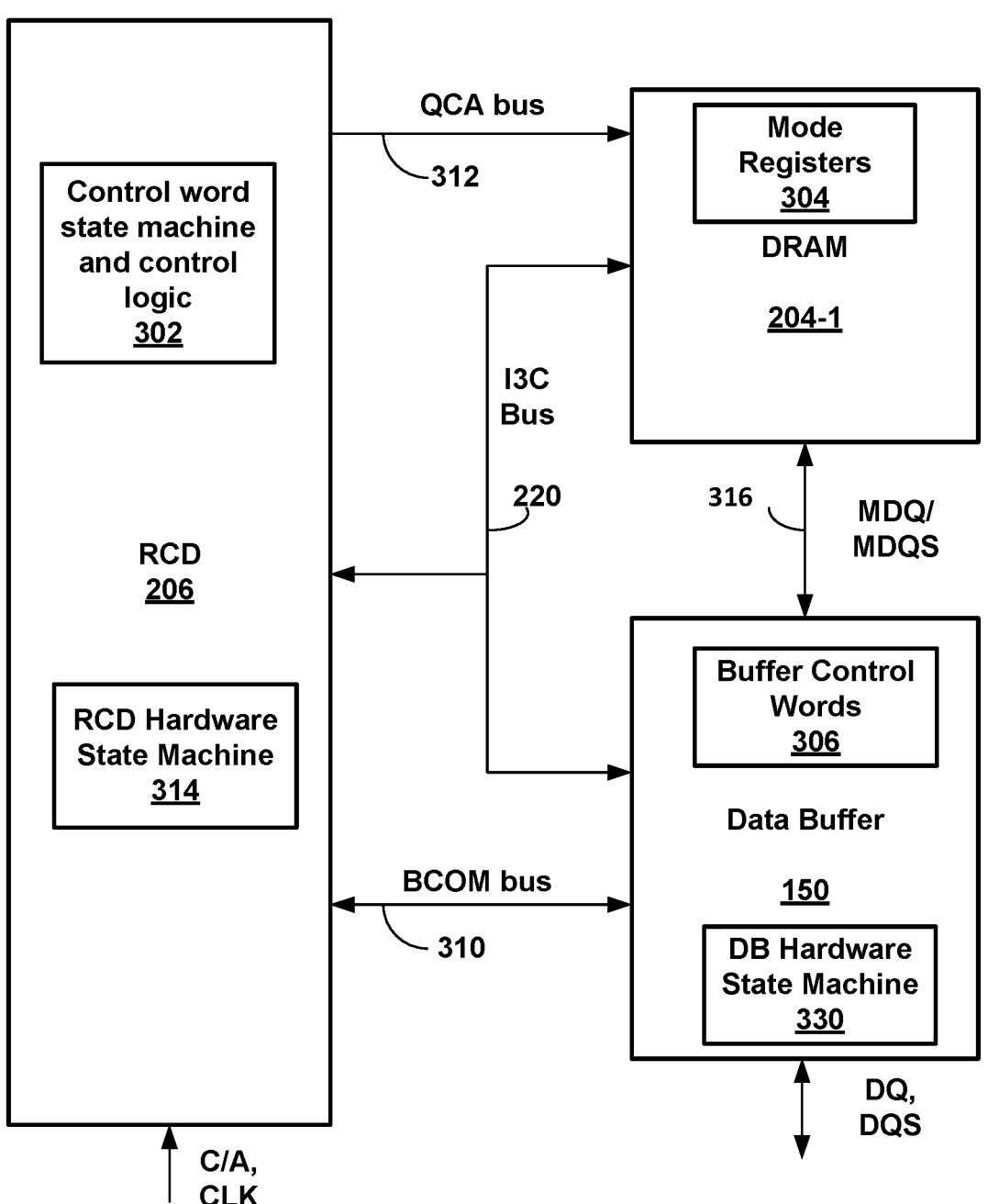
FIG. 3 is a block diagram illustrating communication paths between the RCD, one of the data buffers 150 and one of the Dynamic Random Access Memory (DRAM) chips 204-1 on the memory module 170 used to perform MDQS receive enable training and MDQS read delay training.

FIG. 3 is a block diagram illustrating communication paths between the RCD 206, one of the data buffers 150 and one of the Dynamic Random Access Memory (DRAM) chips 204-1 on the memory module 170 used to perform DRAM to data buffer MDQS receive enable (MRE) training and DRAM to data buffer Read Delay (MRD) training.

The RCD 206 includes control word state machine and control logic 302. The RCD 206 buffers the Command Address (C/A) bus (command bus interface), chip selects, and clock (CLK) between the memory controller 120 and the Dynamic Random Access Memory (DRAM) chips 204-1, . . . , 204-8. The RCD 206 maps the C/A bus bits to CA output bus bits (QCA) on the QCA bus 312 (memory module command bus). The RCD 206 also has an interface to a BCOM bus 310 that is used to communicate with the data buffers 150 on the memory module 170.

Data (MDQ) signal lines and Data Strobe (MDQS) signal lines (MDQ/MDQS 316) between the data buffer 150 and the DRAM 204-1 are named MDQ and MDQS to distinguish them from the DQ and DQS signals on the host side of the data buffer 150 on the memory module 170. The QCA bus 312, BCOM bus 310 and the MDQ signal lines and MDQS signal lines on the MDQ/MDQS bus 312 can be referred to as "backside" buses, that is, internal buses on the memory module 170 that are not accessible by the host.

The RCD 206 sends commands over the QCA bus 312 to the DRAM 204-1, the commands including a training request to perform training on the MDQ/MDQS bus 312. The RCD 206 can generate Mode Register Write (MRW) commands that are sent over the QCA bus 312 to write mode registers 304 in the DRAM 204-1.

The data buffer 150 includes a data buffer (DB) hardware state machine 330 to perform training on the MDQ/MDQS bus. The DB hardware state machine 330 performs RCVEN signal sweep, MDQS first rising edge and functional first rising edge. The DB hardware state machine 330 includes a register to store phase delay and cycle delay for every byte and can store sample results and perform aggregation at each timing point. The RCD 206 can perform aggregation and write back the final values per data buffer 150 or the data buffer 150 can store the final values and send the final values to the RCD 206 via the I3C bus 220. Read of the required registers and the final results from the data buffer 150 can be initiated by the memory controller 120 or the RCD 206. The DB hardware state machine 330 in the data buffer 150 has a status bit that can be read by the RCD 206 to obtain the status of phase alignment and cycle adjustment. A one bit phase alignment bit is read by the RCD 206 to obtain the status of phase alignment. A one bit cycle alignment bit is read by the RCD 206 to obtain the status of cycle adjustment.

The RCD 206 includes a hardware state machine 314 to generate required patterns using a multi-bit linear-feedback shift register (LFSR) or a simple fixed pattern generator. The patterns are checked in the data buffer 150 and stored in the data buffer 150. The RCD hardware state machine 314 can write DRAM mode registers 304. The hardware state machine 314 can generate a Mode Register Write (MRW) command to write any of the mode registers 304 in the DRAM 204-1. The RCD hardware state machine 314 controls timing points inside the data buffer 150 and can send a read command over the I3C bus 220 or the BCOM bus 310. The RCD hardware state machine 314 controls the sweep through BCOM bus 310 for the data buffer 150 and the QCA bus 312 for the DRAM 204-1 to sweep the values within the data buffer 150 and DRAM 204-1 for the corresponding signals (RCVEN or MDQ/MDQS).

A clock signal CLK and Command/Address (C/A) signals are provided from memory controller 120 to the RCD 206. RCD 206 can buffer and relay C/A signals to DRAM chip 204-1 via a QCA bus 312, coupled to the RCD 206 and memory chip 204-1.

The RCD 206 and data buffer 150 communicate over a BCOM bus 310. The BCOM bus 310 includes three bit data buffer command signals BCOM [2:0], a single bit buffer chip select signal BCS_n, a differential buffer clock signal BCK_t, BCK_c, and a BCOM reset (BRST) signal. The three bit data buffer command signals BCOM [2:0] are used to send commands to the data buffer 150. The single bit buffer chip select signal BCS_n is used to select one DRAM chip 204-1 of several connected to the same BCOM bus 310. The differential buffer clock signal BCK_t, BCK_c, which may be derived from a memory controller clock signal in RCD 206, for example, is used as a clock signal for the data buffer 150. The single bit asynchronous buffer reset signal BRST can be used to initialize or reset the data buffer 150.

Figure 4:
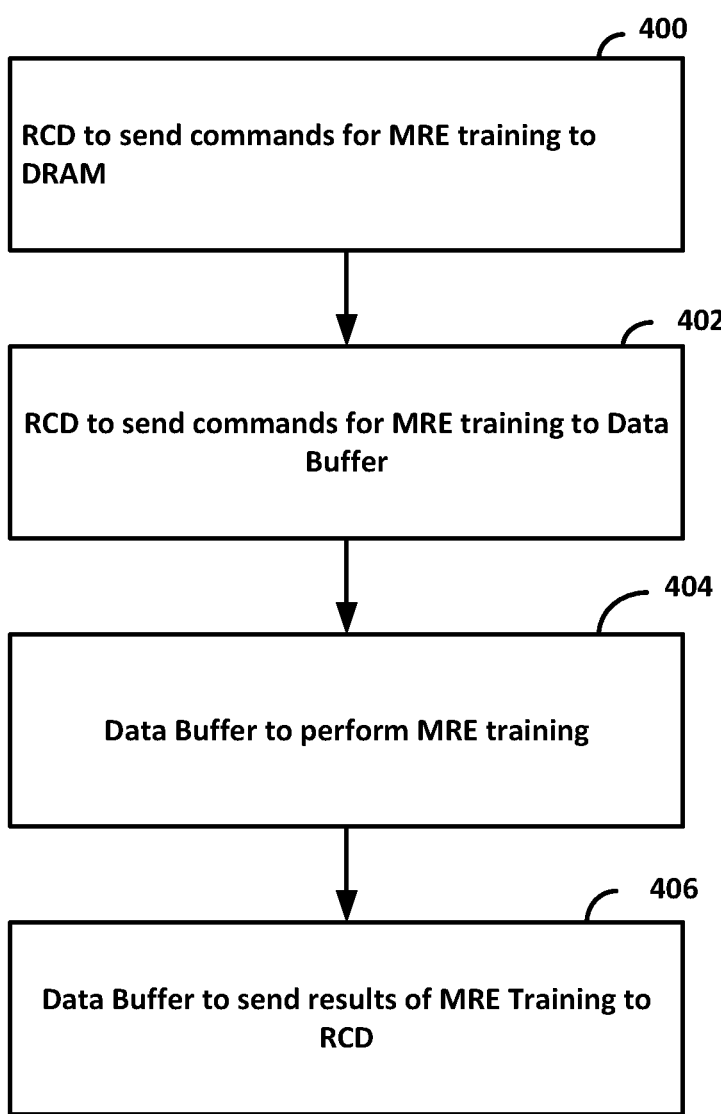
FIG. 4 is a flowgraph illustrating a method to perform DRAM to data buffer receive enable training for the MDQ/MDQS bus between the DRAM and data buffer shown in FIG. 3.

FIG. 4 is a flowgraph illustrating a method to perform DRAM to data buffer MDQS receive enable (MRE) training on the memory module.

MRE training is used to find optimal settings to allow the data buffer 150 to work reliably in the memory module 170. The time at which the data buffer 150 enables its receivers via an internal receive-enable signal (RCVEN signal) to capture data read from the DRAM is configured by the MRE training performed on the memory module 170. After the MRE training is completed, the data buffer 150 is configured to enable its receivers during the preamble of a DQS burst from a read of the DRAM chip 204-1. The RCD 206 orchestrates the MRE training procedure in alignment with the DRAM 204-1 through backside command address/control signals on the QCA bus 312 or I3C bus 220 and the data buffer 150 through the BCOM bus 310 or the I3C bus 220.

MRE training has two stages, phase alignment and cycle adjustment. The phase alignment stage aligns the internal RCVEN signal in the data buffer 150 to any rising edge of the MDQS signal in the preamble of a DQS burst. The cycle adjustment stage aligns the internal RCVEN signal in the data buffer 150 to the first rising edge of the MDQS signal in the preamble of the DQS burst. By the end of training, the RCVEN signal in the data buffer 150 is aligned to the first rising strobe edge (MDQS) of the read burst. The data buffer 150 applies an internal offset adjustment after completion of the MRE training to account for correct centering within the programmed preamble timing.

At block 400, the RCD hardware state machine 314 in the RCD 206 sends commands for MRE training to the DRAM 204-1 to trigger training of the MDQ signal lines and the MDQS signal lines. A command is sent to the DRAM 204-1 to put the DRAM 204-1 into read preamble training mode. The command can be included in an I3C write command that is sent over the I3C bus 220 or can be a Mode Register Write (MRW) command sent on the QCA bus 312. The RCD 206 configures patterns and sends writes to the DRAM location. The RCD 206 sends READ commands to Mode Register Read (MRR) (MR31) on the QCA bus 312 to the DRAM 204-1 to read the data that is received by the data buffer 150. The RCD 206 uses the BCOM bus 310 to put the data buffer 150 in MRE mode. The RCD 206 can use the BCOM bus 310 to enable control word writes to the buffer control words 306 in the data buffer 150.

This generates multiple back-to-back reads (a burst of 32 reads (with appropriate gaps (tCCD_S)). The RCVEN signal transitions from logical 0 to logical 1 once at the start of the burst, that is, at the start of the preamble. The RCD 206 can generate a large gap between every burst of 32 reads, to manage the data buffer 150 or to poll the status of the data buffer 150 and wait for the data buffer 150 to complete. The gap between back-to-back reads is used by the data buffer 150 to set up the next timing point, sample and store the aggregated results and clear counters etc. The burst of back-to-back reads generates a burst of MDQS signals which are sent to the data buffer 150 along with the MDQ signals. The data buffer 150 samples the MDQS signals with the internal RCVEN signal. A larger gap between every burst of 32 back-to-back reads is generated to move to the next value/timing points (that is to sweep the RCVEN signal to the next value).

The RCD 206 sends a sequence of Mode Register Read (MRR) commands to the DRAM chip 204-1 to access the Read Training Pattern. The sequence of MRR commands can be any number of consecutive or non-consecutive MRR commands. The DRAM chip 204-1 is in Preamble Training Mode, causing the MDQS inputs of the data buffer 150 to be differentially LOW other than when the DRAM chip 204-1 responds with a read burst due to the MRR command.

The DRAM chip 204-1 generates a train of pulses on the MDQS inputs of the data buffer 150 according to the number of MRR commands sent by the RCD 206.

At block 402, the RCD 206 sends commands for MRE training to the data buffer 150 and sets up training patterns in the data buffer 150 via the BCOM bus 310. To perform MRE training, the RCD 206 enables MRE training mode in buffer control word RW83 in buffer control words 306 in the data buffer 150. The data buffer 150 uses the RANK_ID field in the MRR Command sequences received through the BCOM[2:0] signals on the BCOM bus 310 to select the receive enable timing control register that is used during training.

At block 404, the data buffer 150 performs MRE training. The data buffer 150 supports Per-Rank, Upper and Lower Nibble—Receive Enable cycle adjustment and Per-Rank, Upper and Lower Nibble—Receive Enable phase adjustment. When the Receive Enable training control bits are all set to zero delay (default settings), the rising edge of the input-referred receive enable is aligned to a rising edge BCK that corresponds to a read latency of Data Buffer Read Latency (DB_RL).

The data buffer 150 sweeps the RCVEN signal coordinated by the RCD 206. The data buffer 150 samples incoming MDQS signal from the DRAM 204-1. The data buffer 150 uses the RCVEN signal to perform sampling of the MDQS (MDQS_c/MDQS_t) signal and sends feedback to the RCD 206 through the I3C bus 220. The data buffer 150 samples the MDQS signal on the rising edge of the RCVEN signal. For multiple back-to-back reads, the data buffer 150 only samples on the first read of the multiple back-to-back reads.

The RCD 206 and data buffer 150 operate coherently with the RCD 206 offloading the MRE training to the data buffer 150 and polling the data buffer 150 for completion of the MRE training. The RCD 206 waits for the data buffer 150 to complete coarse (find the first edge) and fine sweep (first functional rising edge) which is determined by the state of the complete status bit in the hardware state machine 330. The order of coarse and fine sweep are interchangeable.

While in MRE training mode, the data buffer 150 uses programmable delay elements and sampling circuits to capture the MDQS signals received from the DRAM chip 204-1. The rising edge of the data buffer Receive Enable (RCVEN) signal is used to sample the received MDQS signals.

The objective of MRE training is to find the end of the DRAM read preamble, that is, the first effective rising edge of MDQS. At this time, the output of the sampling circuits change from LOW to HIGH. With this method, the data buffer 150 can align the rising edge of the internal RCVEN signal to the first effective rising edge of the incoming MDQS signals.

Sweeping of the RCVEN signal within the data buffer 150 can be coordinated by the RCD 206 through BCOM commands sent over the BCOM bus 310. The hardware state machine 330 in the data buffer 150 sweeps the internal RCVEN signal and samples MDQS on the first rising edge of the RCVEN signal. The eye margin results (left and right margins) of the sweeping of the RCVEN signal are stored in the data buffer 150 and if required the eye margin results ("value") are sent to the RCD 206 over the I3C bus.

The data buffer 150 finds the functional first rising edge of the RCVEN signal. The hardware state machine 330 counts the samples and stores the aggregated results at nibble (DQS) per data buffer level. The RCD 206 waits for Coarse (find the first edge of the RCVEN signal) and fine sweep (first functional rising edge of the RCVEN signal) to be completed by the data buffer 150 and looks for a complete status bit from the hardware state machine 330. The final aggregated results are stored per nibble in the data buffer 150.

The data buffer 150 uses combinations of cycle and phase settings to determine the first effective rising strobe edge of the read data burst (back to back reads are sent in burst mode with burst length 16 (BL16). The RCD 206 may send any number of back-to-back DRAM MRR commands to accomplish this step. The data buffer 150 samples only during the rising edge of the RCVEN signal and holds this sample until the next RCVEN rising edge. Using the output of the sampling circuits available on the MDQ signals, the data buffer 150 can determine if it needs to increase or decrease the receive enable phase control settings in the data buffer 150.

For back-to-back DRAM-space MRRs, there is only one rising edge of the RCVEN signal at the beginning of the contiguous burst. The data buffer 150 applies an internal offset adjustment after training to account for correct centering within the programmed preamble timing. The final offset takes effect after the RCD 206 exits the MRE training mode.

At block 406, the results of the MRE training are sent to the RCD 206. At the end of the MRE training, the data buffer 150 has aligned the RCVEN signal to its first rising edge of the MDQS signal. The MRE training can be performed in parallel on multiple data buffers 150 on the memory module to speed up the training time.

On Multiplexed Rank (MR) DIMMs there are 2 MDQS strobes per nibble (PS0 and PS1). The Host Memory controller or the RCD 206 can perform a read over the I3C bus to determine if the data buffer 150 has completed the MRE training. The configuration of each nibble (PS0 and PS2) can be performed via the BCOM bus or the I3C bus.

As discussed, the MRE training is performed on the memory module 170 instead of by the host which reduces the host cycles required to perform MRE training and reduces time for MRE training on each boot of the system. Status can be read via the I3C bus before the DQ bus training is completed. With MRE training performed on the memory module 170 instead of by the host, MRE training can be performed in parallel on multiple DIMMs in a system. The MRE training can be performed on any buffered DIMM, for example, a Multiplexed Rank MINIM (MRDIMM) or a Compute Express Link (CXL) buffer based DIMM.

To exit MRE training mode, the RCD 206 sends an MRW to buffer control word RW83 in buffer control words 306 in the data buffer 150 to resume normal operation or enable another training mode.

Figure 5:
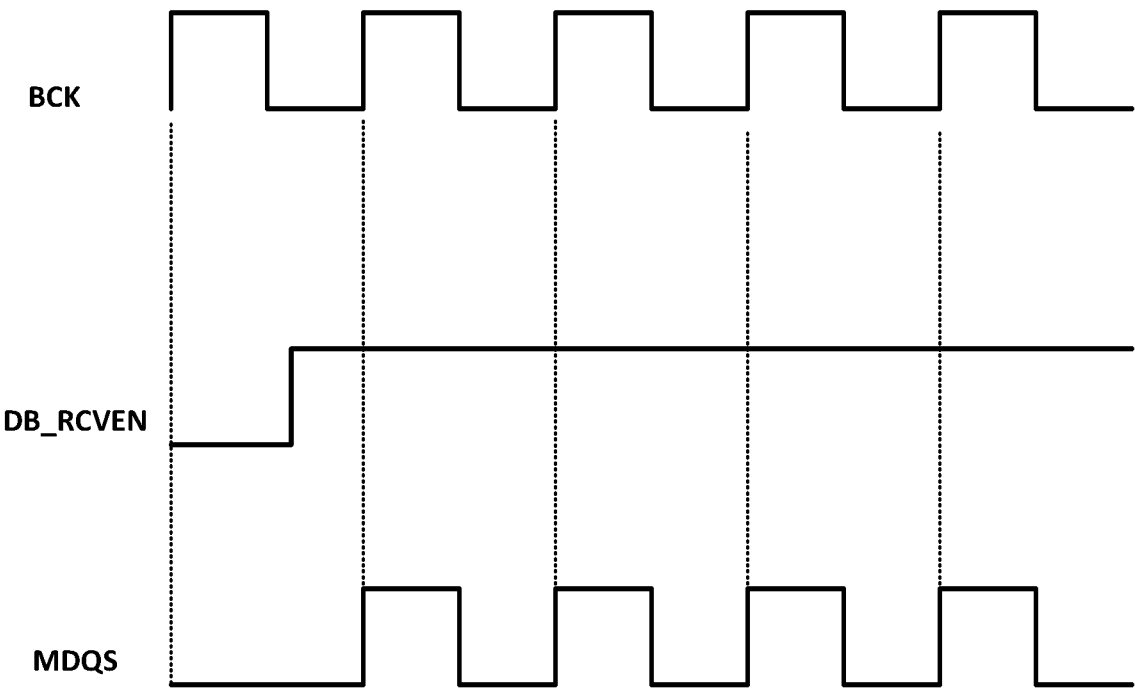
FIG. 5 is a timing diagram for MRE training illustrating the relationship between the RCVEN signal, the MDQS signals and the MDQ signals.

FIG. 5 is a timing diagram for MRE training illustrating the relationship between the RCVEN signal and the MDQS/ MDQ signals. The RCVEN signal is '1' (high) when input receivers in the data buffer 150 are enabled for sampling the MDQS strobe signals from the DRAM device 204-1.

Figure 6:
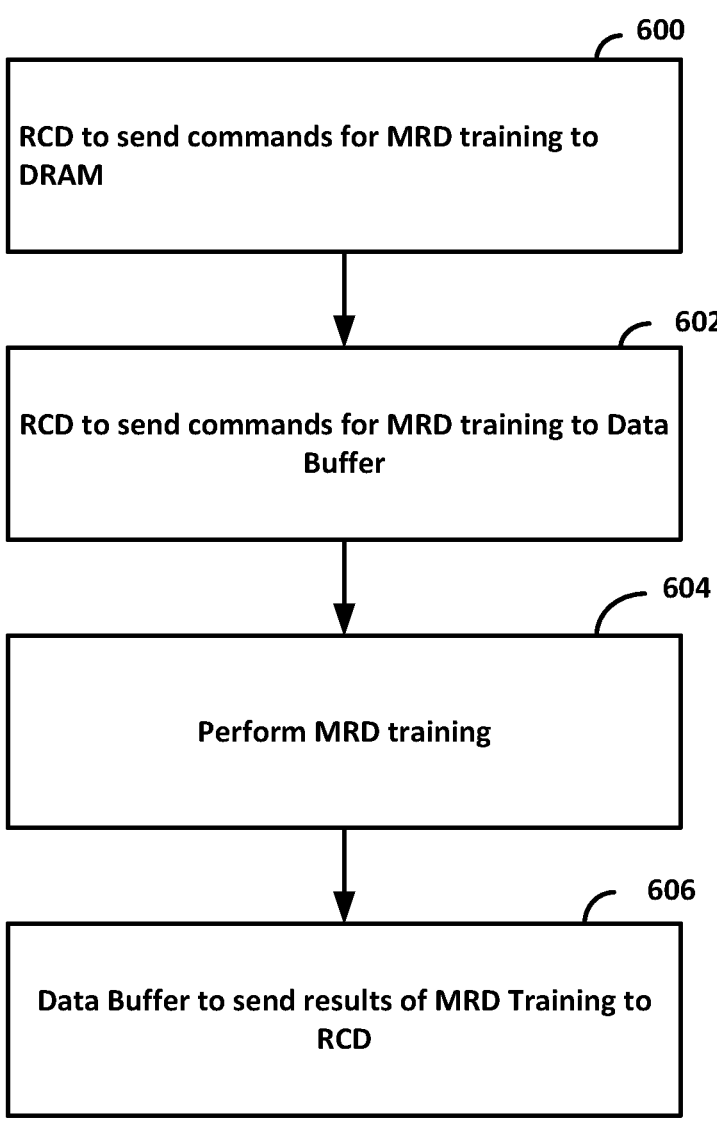
FIG. 6 is a flowgraph illustrating a method to perform DRAM to data buffer read delay training for the MDQ/MDQS bus between the DRAM and data buffer shown in FIG. 3.

FIG. 6 is a flowgraph illustrating a method to perform DRAM to data buffer MDQS read delay (MRD) training on the memory module 170.

In MRD Training mode, MDQS delay adjustments are performed in the data buffer 150 so that the data buffer 150 can correctly sample the data driven on the MDQ signals by the Dynamic Random Access Memory (DRAM) chip 204-1. The data buffer 150 provides data pattern control words that are programmed with the expected read data pattern from the Dynamic Random Access Memory (DRAM) chip 204-1 and the results of the comparison are provided to the RCD 206.

The RCD 206 coordinates the MRD procedure in alignment with the DRAM 204-1 over the QCA bus 312 or the I3C bus 220 and the data buffer 150 over the BCOM bus 310 or the I3C bus. The data buffer 150 sweeps the delay of MDQS with regards to MDQ, while the RCD 206 sends reads to the DRAM 204-1 in read training pattern mode (MRR to MR31). The RCD 206 generates and configures DB patterns (same pattern) for read delay, to avoid swizzling problems. In another embodiment, the data buffer 150 generates the patterns.

At block 600, the RCD 206 sends commands for MRD training to the DRAM 204-1 to trigger training of the MDQ signal lines and the MDQS signal lines. The RCD 206 configures patterns (same pattern) for read delay in the data buffer 150 by sending write commands to control words in the data buffer over the BCOM bus. For example, the data patterns can be written to control words RW99 to RW9D in the data buffer 150. The RCD 206 also configures patterns in mode registers (for example, MR25-MR30) in the DRAM (MR25-30) by sending write commands to the mode registers over the I3C bus or by sending MRW commands over the QCA bus to the DRAM.

At block 602, the RCD 206 sends a command to the data buffer 150 to drive generated patterns (LFSR) on the MDQ pins, that is, 32 back-to-back reads with an 8 clocks bubble in between the bursts. The patterns could be the same or could be repeating patterns with or without DQ inversion to perform MRD training, the RCD 206 enables MRD training mode in buffer control word RW83 in buffer control words 306 in the data buffer 150.

At block 604, MRD training is performed. The RCD 206 can control sweep of the MDQS signals with respect to the MDQ signals by the data buffer 150 to find the center or the data buffer 150 can perform the sweep of the MDQS signals with respect to the MDQ signals autonomously. The data buffer 150 performs a per nibble/MDQ, MDQS sweep comparison and stores the result (a match '1' or a mis-compare '0').

MRD Training includes performing coarse MDQS delay using the same pattern on all lanes, performing backside swizzle discovery to discover the MDQ lane mapping and performing per-bit MDQS Read Delay to fine tune per-bit delay.

The delay of the DRAM interface data strobe signals (MDQ) during read transactions is selected by buffer control words 306 for upper and lower nibble respectively. The nominal setting for the delay is one quarter of a cycle delay. While in MRD training mode, the data buffer 150 treats any DRAM-space MRR as a short MRR. A sequence of short MRRs may be used by the RCD 206 to generate back-to-back BL16 read transfers from the DRAM 204-1 to the data buffer 150. In this training mode, the data buffer 150 uses a data pattern comparator to determine if the read data from the DRAM 204-1 matches an expected result. The expected data pattern values can be stored in Read Pattern 0 and Read Pattern 1 in buffer control words RWE3 and RWE4, or the expected data pattern is generated by an LFSR pattern generator in the RCD 206. The data buffer 150 compares the data read from DRAM 204-1 with the expected data and stores the eye margin.

Buffer control words RWE2 through RWE6 in buffer control words 306 in data buffer 150 are used to configure the pattern generators. When the LFSR pattern generators are enabled, the data buffer 150 can send a long sequence of MRR commands for continuous comparison to the read training pattern.

In addition to driving the MDQ pins, status for the pattern comparison is also provided in Buffer Training Status word RW98. The status provided in RW98 can be modified by the Buffer Training Configuration control word RW97, to provide status of a mis-compare with or without Unit Interval (UI) filtering applied. The status in RW98 is per DQ lane.

The memory module supports fine adjustment of the phase of individual MDQ bit lanes relative to the baseline MDQS. The data buffer 150 can utilize the per lane MDQS-MDQ read delay control words. MDQ0/4 read delay control word RWEA controls the phase of bits MDQ0 and MDQ4 within the lower and upper nibble respectively for Rank 0, MDQ1/MDQ5 read delay control word RWEB controls the phase of bits MDQ1 and MDQS for Rank 0, and so on. Since all bits within a nibble are generally aligned by routing, only a small range of +/−3/64 tCK is provided for fine-grained adjustment of individual bit lane delay differences. A negative delay in these control words means that the particular data lane requires slightly less delay than the previously established MDQS delay in MDQS read delay control words RWE5:RWE4 for the entire nibble. A positive delay in these control words means that the particular data lane requires slightly more delay than the previously established MDQS delay in MDQS read delay control words RWE5:RWE4 for the entire nibble.

At block 606, the training results stored in the data buffer 150 are polled by the RCD 206 or the data buffer 150. The data buffer 150 sends status to the RCD 206 over the I3C bus 220.

To exit MRD training mode, the RCD 206 sends an MRW to buffer control word RW83 in buffer control words 306 in the data buffer 150 to resume normal operation or enable another training mode.

Figure 7:
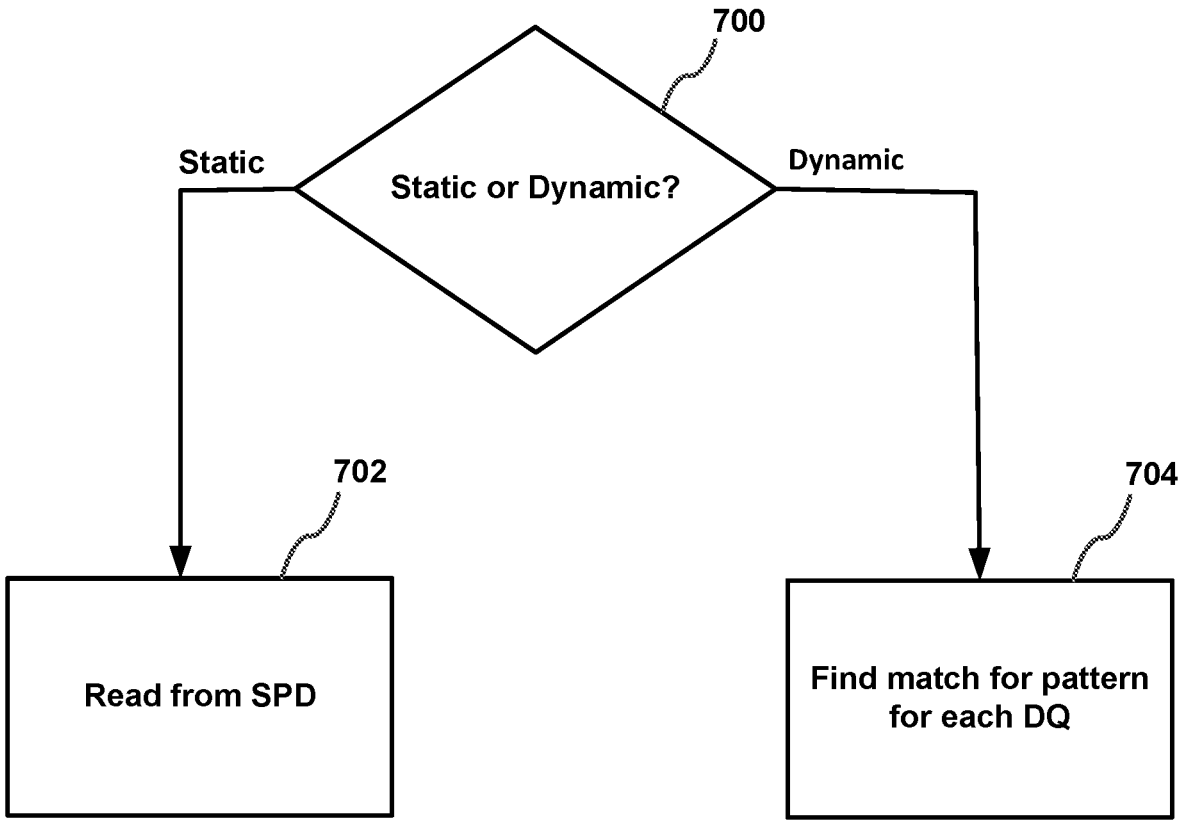
FIG. 7 is a flowgraph illustrating a method to perform backside swizzle discovery to discover the MDQ lane mapping.

FIG. 7 is a flowgraph illustrating a method to perform backside swizzle discovery to discover the MDQ lane mapping.

At block 700, if dynamic discovery is to be performed, processing continues with block 704. If static discovery is to be performed, processing continues with block 702.

At block 702, the RCD 206 reads the mapping stored in the SPD device 222 and creates patterns according to the mapping.

At block 704, a pattern is sent to each DQ in the DRAM 204-1, with the pattern sent to one DQ at a time. A round robin is performed to determine a match and the DQ is mapped with its associated DQS.

Figure 8:
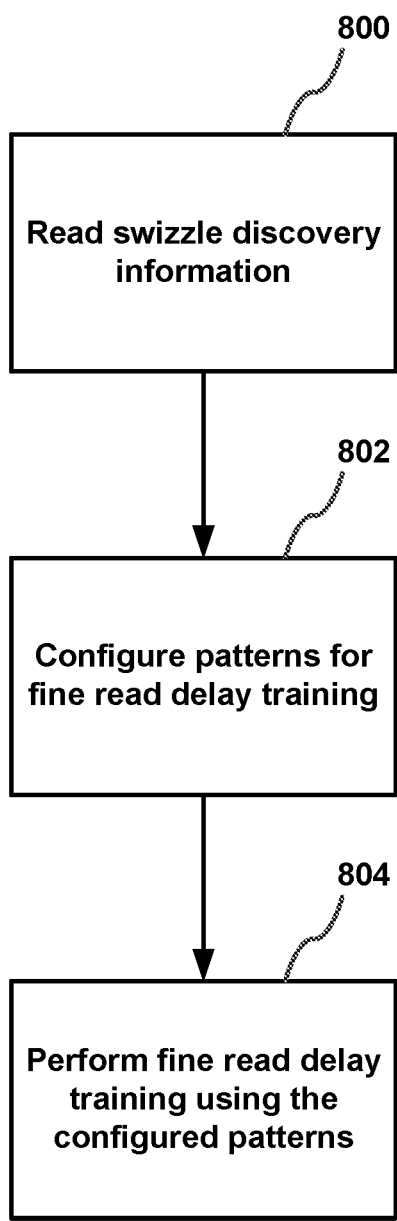
FIG. 8 is a flowgraph illustrating a method to perform per-bit MDQS Read Delay to fine tune per-bit delay.

FIG. 8 is a flowgraph illustrating a method to perform per-bit MDQS Read Delay to fine tune per-bit delay. As part of fine read delay training, the patterns can be set per DQ level and Per-Bit MDQS Read Delay Deskew (Fine tune per-nibble/per-bit delay, more stressful pattern) can be performed to get a more accurate margin for each of the DQ bit.

At block 800, the RCD 206 reads the swizzle discovery information stored in the SPD device 222 to determine which bit is mapped to each DQS in each DRAM 204-1.

At block 802, the RCD 206 configures patterns for the fine read delay training.

At block 804, the data buffer 150 performs fine read delay training using the patterns configured by the RCD 206 to obtain a more accurate margin for each DQ bit.

In another embodiment, data buffer 150 to DRAM 204-1 swizzling discovery can be automated so that the data buffer 150 can send a pattern per bit and determine the map. Alternatively, an independent pattern can be stored in DRAM (using 4 LFSRs to provide 16-bits).

A bypass mode can be provided to allow the host to perform the fine read delay training to perform fine tuning of eye margin for each DQ bit. The host can use the baseline MDQS and send functional patterns to fine tune the eye margin for each DQ bit.

Figure 9:
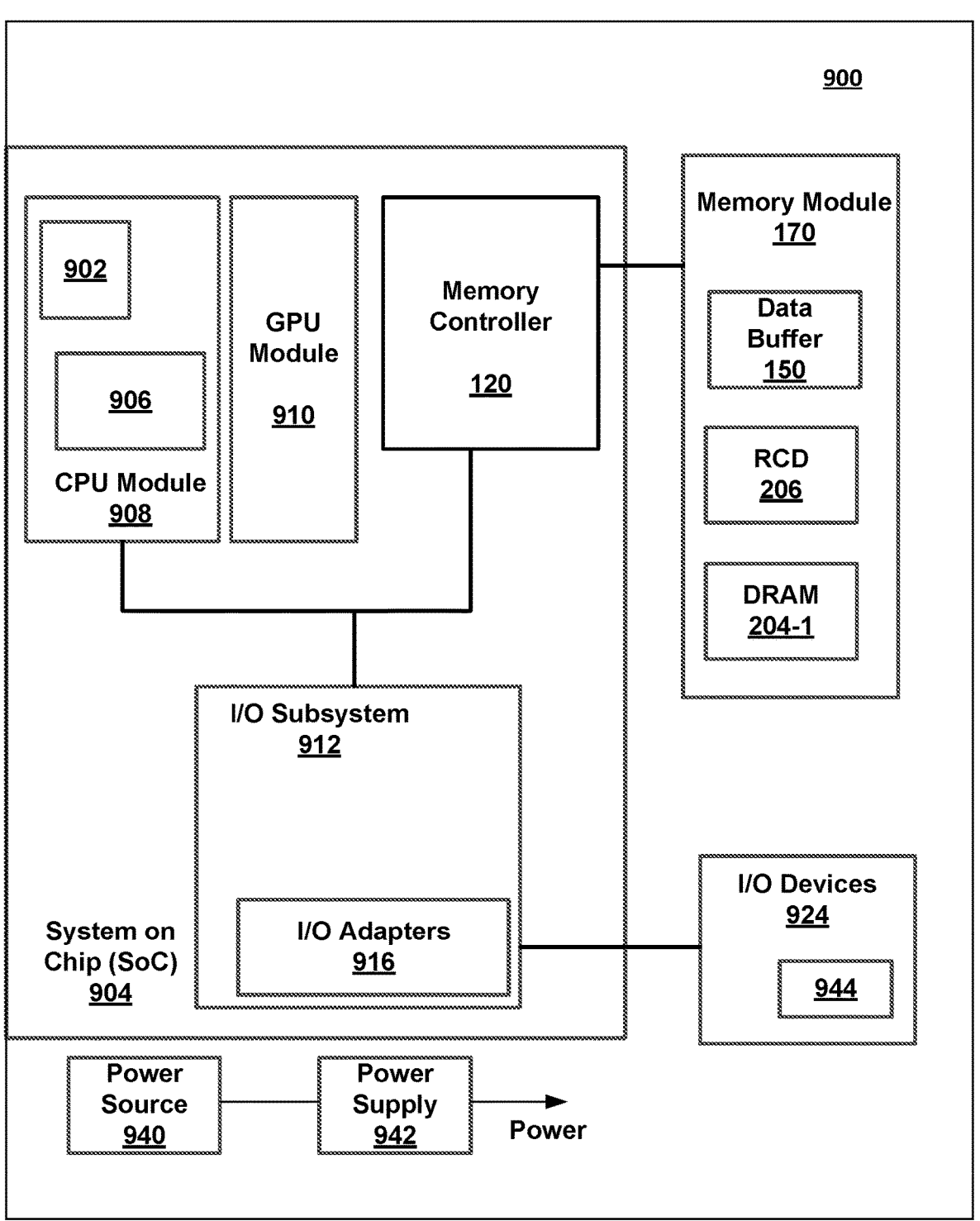
FIG. 9 is a block diagram of an embodiment of a computer system that includes the data buffer in the memory module shown in FIG. 1.

FIG. 9 is a block diagram of an embodiment of a computer system 900 that includes the data buffer 150 in the memory module 170 shown in FIG. 1. Computer system 900 can correspond to a computing device including, but not limited to, a server, a workstation computer, a desktop computer, a laptop computer, and/or a tablet computer.

The computer system 900 includes a system on chip (SOC or SoC) 904 which combines processor, graphics, memory, and Input/Output (I/O) control logic into one SoC package. The SoC 904 includes at least one Central Processing Unit (CPU) module 908, a memory controller 120, and a Graphics Processor Unit (GPU) 910. In other embodiments, the memory controller 120 can be external to the SoC 904. The CPU module 908 includes at least one processor core 902, and a level 2 (L2) cache 906.

Although not shown, each of the processor core(s) 902 can internally include one or more instruction/data caches, execution units, prefetch buffers, instruction queues, branch address calculation units, instruction decoders, floating point units, retirement units, etc. The CPU module 908 can correspond to a single core or a multi-core general purpose processor, such as those provided by Intel® Corporation, according to one embodiment.

The Graphics Processor Unit (GPU) 910 can include one or more GPU cores and a GPU cache which can store graphics related data for the GPU core. The GPU core can internally include one or more execution units and one or more instruction and data caches. Additionally, the Graphics Processor Unit (GPU) 910 can contain other graphics logic units that are not shown in FIG. 9, such as one or more vertex processing units, rasterization units, media processing units, and codecs.

Within the I/O subsystem 912, one or more I/O adapter(s) 916 are present to translate a host communication protocol utilized within the processor core(s) 902 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 916 can communicate with external I/O devices 924 which can include, for example, user interface device(s) including a display and/or a touch-screen display 944, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)). The display 944 to display data stored in the plurality of memory devices in the memory module 170.

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

Power source 940 provides power to the components of system 900. More specifically, power source 940 typically interfaces to one or multiple power supplies 942 in system 900 to provide power to the components of system 900. In one example, power supply 942 includes an AC to DC (alternating current to direct current) adapter to plug into a wall outlet. Such AC power can be renewable energy (e.g., solar power) power source 940. In one example, power source 940 includes a DC power source, such as an external AC to DC converter. In one example, power source 940 or power supply 942 includes wireless charging hardware to charge via proximity to a charging field. In one example, power source 940 can include an internal battery or fuel cell source.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope.

Therefore, the illustrations and examples herein should be construed in an illustrative, and not a restrictive sense. The scope of the invention should be measured solely by reference to the claims that follow.

What is claimed is:

1. A memory module comprising:
a memory integrated circuit including a data bus having memory module data (MDQ) signal lines and memory module data strobe (MDQS) signal lines;
a Registering Clock Driver (RCD) including a command bus interface to a host memory controller and a memory module command bus (QCA) interface to the memory integrated circuit, the RCD to trigger training of the MDQ signal lines and the MDQS signal lines; and
a data buffer coupled to the MDQ signal lines and the MDQS signal lines, the data buffer including a hardware state machine to perform training of the MDQS signal lines and the MDQ signal lines in response to a training request received from the RCD.

2. The memory module of claim 1, wherein the training request is MDQS Receive Enable (MRE) training.

3. The memory module of claim 1, wherein the training request is MDQS Read Delay (MRD) training.

4. The memory module of claim 1, wherein the training is performed prior to enabling normal operation of the memory integrated circuit.

5. The memory module of claim 1, wherein the memory integrated circuit is a Dynamic Random Access Memory (DRAM) and the memory module is a Load Reduced Double Data Rate Dual In-Line Memory Module (LR-DIMM).

6. The memory module of claim 1, wherein the memory integrated circuit is a Dynamic Random Access Memory (DRAM) and the memory module is a Multiplexed Rank Dual In-Line Memory Module (MR-DIMM).

7. A system comprising:
a memory controller; and
a memory module comprising:
a memory integrated circuit including a data bus having memory module data (MDQ) signal lines and memory module data strobe (MDQS) signal lines;
a Registering Clock Driver (RCD) including a command bus interface to a host memory controller and a memory module command bus (QCA) interface to the memory integrated circuit, the RCD to trigger training of the MDQ signal lines and the MDQS signal lines; and
a data buffer coupled to the MDQ signal lines and the MDQS signal lines, the data buffer including a hardware state machine to perform training of the MDQS signal lines and the MDQ signal lines in response to a training request received from the RCD.

8. The system of claim 7, wherein the training request is MDQS Receive Enable (MRE) training.

9. The system of claim 7, wherein the training request is MDQS Read Delay (MRD) training.

10. The system of claim 7, wherein the training is performed prior to enabling normal operation of the memory integrated circuit.

11. The system of claim 7, wherein the memory integrated circuit is a Dynamic Random Access Memory (DRAM) and the memory module is a Load Reduced Double Data Rate Dual In-Line Memory Module (LR-DIMM).

12. The system of claim 7, wherein the memory integrated circuit is a Dynamic Random Access Memory (DRAM) and the memory module is a Multiplexed Rank Dual In-Line Memory Module (MR-DIMM).

13. The system of claim 7, further comprising one or more of:
at least one processor communicatively coupled to the memory controller;
a display communicatively coupled to at least one processor; or
a battery to power the system.

14. A method, to perform training of a data bus in a memory module, comprising:
triggering training of memory module data (MDQ) signal lines and memory module data strobe (MDQS) signal lines, by a Registering Clock Driver (RCD), the RCD including a command bus interface to a host memory controller and a memory module command bus (QCA) interface to a memory integrated circuit, the memory integrated circuit including a data bus having the MDQ signal lines and the MDQS signal lines; and
performing training of the MDQS signal lines and the MDQ signal lines, by a hardware state machine in a data buffer coupled to the MDQ signal lines and the MDQS signal lines, in response to a training request received from the RCD.

15. The method of claim 14, wherein the training request is MDQS Receive Enable (MRE) training.

16. The method of claim 14, wherein the training request is MDQS Read Delay (MRD) training.

17. The method of claim 14, wherein the training is performed prior to enabling normal operation of the memory integrated circuit.

18. The method of claim 14, wherein the memory integrated circuit is a Dynamic Random Access Memory (DRAM) and the memory module is a Load Reduced Double Data Rate Dual In-Line Memory Module (LR-DIMM).

19. The method of claim 14, wherein the memory integrated circuit is a Dynamic Random Access Memory (DRAM) and the memory module is a Multiplexed Rank Dual In-Line Memory Module (MR-DIMM).

* * * * *